(12) United States Patent
Kito et al.

(10) Patent No.: US 8,440,528 B2
(45) Date of Patent: May 14, 2013

(54) METHOD FOR MANUFACTURING A VERTICAL NONVOLATILE SEMICONDUCTOR MEMORY DEVICE INCLUDING FORMING FLOATING GATES WITHIN THE RECESSES CREATED ON THE INTERLAYER INSULATING FILMS

(75) Inventors: Masaru Kito, Kanagawa-ken (JP); Masaru Kidoh, Tokyo (JP); Tomoko Fujiwara, Kanagawa-ken (JP); Yosuke Komori, Kanagawa-ken (JP); Megumi Ishiduki, Kanagawa-ken (JP); Hiroyasu Tanaka, Tokyo (JP); Yoshiaki Fukuzumi, Kanagawa-ken (JP); Ryota Katsumata, Kanagawa-ken (JP); Ryouhei Kirisawa, Kanagawa-ken (JP); Junya Matsunami, Kanagawa-ken (JP); Hideaki Aochi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 445 days.

(21) Appl. No.: 12/638,480

(22) Filed: Dec. 15, 2009

(65) Prior Publication Data
US 2010/0181612 A1   Jul. 22, 2010

(30) Foreign Application Priority Data
Jan. 22, 2009   (JP) ................. 2009-012052

(51) Int. Cl.
*H01L 21/336*   (2006.01)
*H01L 21/4763*   (2006.01)

(52) U.S. Cl.
USPC ........... 438/267; 438/201; 438/211; 438/594; 438/596; 257/E21.422

(58) Field of Classification Search .............. 257/315, 257/320, E21.422; 438/201, 211, 257, 259, 438/267, 594, 596
See application file for complete search history.

(56) References Cited

U.S. PATENT DOCUMENTS
7,026,684 B2   4/2006   Sakuma et al.
7,969,789 B2 *   6/2011   Katsumata et al. ...... 365/185.28
(Continued)

FOREIGN PATENT DOCUMENTS
| JP | 2007-266143 | 10/2007 |
|---|---|---|
| KR | 10-2005-0029693 | 3/2005 |
| KR | 10-2007-0096972 | 10/2007 |
| KR | 10-2008-0092290 | 10/2008 |
| WO | WO 2009/075370 A1 | 6/2009 |

OTHER PUBLICATIONS

Korean Office Action issued on Apr. 20, 2011 in corresponding Korean Application No. 10-2010-0005621 (with an English Translation).
U.S. Appl. No. 12/679,991, filed Mar. 25, 2010, Fukuzumi et al.
U.S. Appl. No. 13/112,345, filed May 20, 2011, Imamura et al.
U.S. Appl. No. 13/600,991, filed Aug. 31, 2012, Sakamoto, et al.

*Primary Examiner* — Anh Mai
(74) *Attorney, Agent, or Firm* — Oblon, Spivak, McClelland, Maier & Neustadt, L.L.P.

(57) ABSTRACT

A nonvolatile semiconductor memory device includes: forming a stacked body by alternately stacking a plurality of interlayer insulating films and a plurality of control gate electrodes; forming a through-hole extending in a stacking direction in the stacked body; etching a portion of the interlayer insulating film facing the through-hole via the through-hole to remove the portion; forming a removed portion; forming a first insulating film on inner faces of the through-hole and the portion in which the interlayer insulating films are removed; forming a floating gate electrode in the portion in which the interlayer insulating films are removed; forming a second insulating film so as to cover a portion of the floating gate electrode facing the through-hole; and burying a semiconductor pillar in the through-hole.

5 Claims, 16 Drawing Sheets

U.S. PATENT DOCUMENTS

| | | |
|---|---|---|
| 2004/0079988 A1 | 4/2004 | Harari |
| 2006/0060911 A1 | 3/2006 | Sakuma et al. |
| 2007/0252201 A1 | 11/2007 | Kito et al. |
| 2009/0146206 A1* | 6/2009 | Fukuzumi et al. ............ 257/324 |
| 2009/0230458 A1* | 9/2009 | Ishiduki et al. ............... 257/324 |
| 2010/0001247 A1* | 1/2010 | Jaimes ....................... 256/65.01 |
| 2011/0084331 A1* | 4/2011 | Tanaka et al. ................. 257/324 |
| 2012/0028450 A1* | 2/2012 | Son et al. ...................... 438/479 |

* cited by examiner

METHOD FOR MANUFACTURING A VERTICAL NONVOLATILE SEMICONDUCTOR MEMORY DEVICE INCLUDING FORMING FLOATING GATES WITHIN THE RECESSES CREATED ON THE INTERLAYER INSULATING FILMS

CROSS-REFERENCE TO RELATED APPLICATIONS

This application is based upon and claims the benefit of priority from the prior Japanese Patent Application No. 2009-12052, filed on Jan. 22, 2009; the entire contents of which are incorporated herein by reference.

BACKGROUND OF THE INVENTION

1. Field of the Invention

The invention relates to a nonvolatile semiconductor memory device in which control gate electrodes and interlayer insulating films are alternately stacked and a method for manufacturing the same.

2. Background Art

Thus far, nonvolatile semiconductor memory devices such as flash memory have been fabricated by integrating elements two-dimensionally on the surface of a silicon substrate. In such flash memories, the only thing to reduce cost per one bit to increase memory capacity is to lower the dimension of each element to allow miniaturization. However, such miniaturization is becoming difficult these days in terms of cost and technique.

Improvement in photolithographic technique is necessary in order to promote the miniaturization of elements. Current ArF immersion exposure technique has modification limits of rules near 40 nm, and employing an EUV (extreme ultraviolet) exposure apparatus is necessary for further miniaturization. However, EUV exposure apparatuses are very high in cost and not practical. Even if miniaturization is achieved by using an EUV exposure apparatus, it is expected that breakdown voltage between elements and the like reaches the physical limit unless driving voltage also is scaled, and there is a high possibility that operation as a device becomes difficult.

Therefore, many ideas of integrating elements three-dimensionally are proposed as a technique for breaking through the limit of high integration. However, since common three-dimensional devices require several lithography steps for each layer, the increased cost due to the increased number of lithography steps cancels the reduced cost due to the reduced area of a silicon substrate. Therefore, cost reduction is difficult even if elements are integrated three-dimensionally.

In view of this problem, the inventor and others have proposed a three-dimensional stacked memory of collective-processing type (for example, see JP-A 2007-266143 (Kokai)). In this technique, electrode films and insulating films are alternately stacked on a silicon substrate to form a stacked body, and then a through-hole is formed in the stacked body by collective processing. Then, a charge storage layer is formed on the side face of the through-hole and silicon is buried in the through-hole to form a silicon pillar. Thereby, a MONOS (metal-oxide-nitride-oxide-silicon) type transistor is formed at the intersection of each electrode film and the silicon pillar, and this forms a memory cell.

In this three-dimensional stacked memory of collective-processing type, a charge can be transferred between each electrode film and each silicon pillar by controlling the electric potentials of the electrode film and the silicon pillar, and thereby information can be recorded. According to this technique, a plurality of electrode films are stacked on the silicon substrate, and thereby chip area per one bit can be reduced, serving to reduce the cost of a wafer. Furthermore, the three-dimensional stacked memory can be fabricated by processing the stacked body collectively; therefore, the number of lithography steps does not increase even if the number of stacked layers increases, and an increase in manufacturing cost can be suppressed.

However, the three-dimensional stacked memory of collective-processing type thus fabricated has a problem that the erasing speed is slow because the memory cell is configured by a MONOS type transistor. Furthermore, since the charge storage layer is continuously formed in the through-hole, there is a problem that interference between memory cells increases as miniaturization progresses.

SUMMARY OF THE INVENTION

According to an aspect of the invention, there is provided a nonvolatile semiconductor memory device including: a stacked body in which a plurality of interlayer insulating films and a plurality of control gate electrodes are alternately stacked and a through-hole extending in a stacking direction is formed; a semiconductor pillar buried in the through-hole; a floating gate electrode provided between the control gate electrodes; a first insulating film provided between the semiconductor pillar and the floating gate electrode, and the control gate electrodes; and a second insulating film provided between the semiconductor pillar and the floating gate electrode.

According to another aspect of the invention, there is provided a nonvolatile semiconductor memory device including: a semiconductor pillar; a plurality of control gate electrodes provided around the semiconductor pillar; and a plurality of floating gate electrodes provided around the semiconductor pillar, the semiconductor pillar, each of the control gate electrodes, and each of the floating gate electrodes being away from each other, and the control gate electrodes and the floating gate electrodes being alternately arranged along a direction in which the semiconductor pillar extends.

According to still another aspect of the invention, there is provided a method for manufacturing a nonvolatile semiconductor memory device including: forming a stacked body by alternately stacking a plurality of interlayer insulating films and a plurality of control gate electrodes; forming a through-hole extending in a stacking direction in the stacked body; etching a portion of the interlayer insulating films facing the through-hole via the through-hole to remove the portion; forming a first insulating film on inner faces of the through-hole and the portion in which the interlayer insulating films are removed; forming a floating gate electrode in the portion in which the interlayer insulating film is removed; forming a second insulating film so as to cover a portion of the floating gate electrode facing the through-hole; and burying a semiconductor pillar in the through-hole.

DETAILED DESCRIPTION OF THE INVENTION

Embodiments of the invention will now be described with reference to the drawings.

First, a first embodiment of the invention will now be described.

Figure 1:
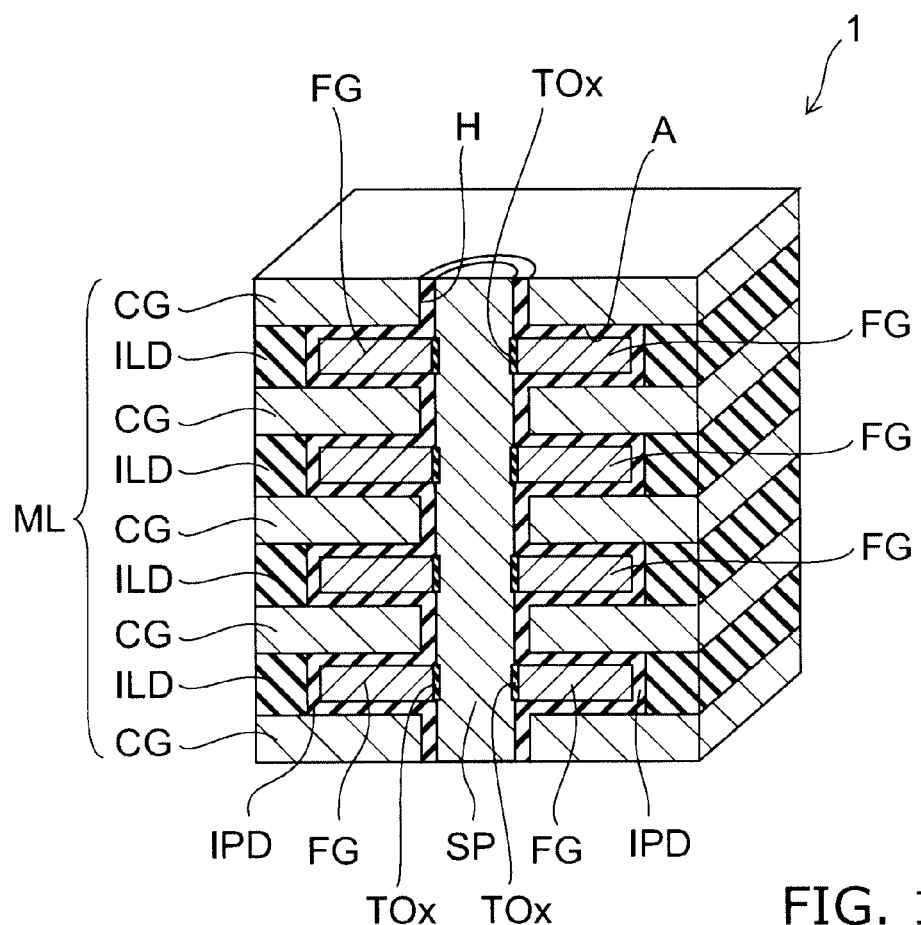
FIG. 1 is a perspective cross-sectional view illustrating a nonvolatile semiconductor memory device according to a first embodiment of the invention embodiment.

FIG. 1 is a perspective cross-sectional view illustrating a nonvolatile semiconductor memory device according to this embodiment.

Figure 2:
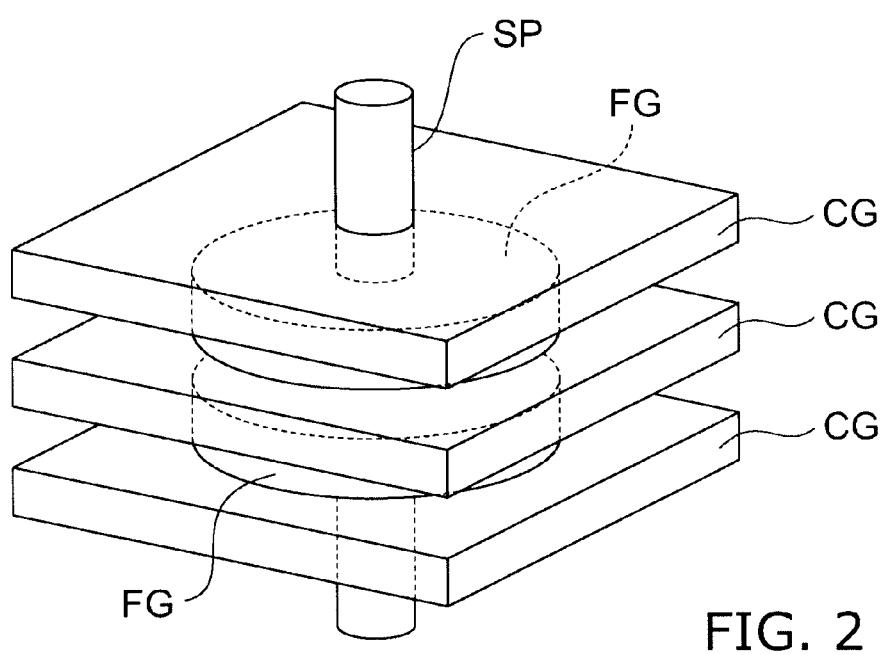
FIG. 2 is a perspective view illustrating a nonvolatile semiconductor memory device according to the first embodiment.

FIG. 2 is a perspective view illustrating the nonvolatile semiconductor memory device according to this embodiment.

In FIG. 2, for convenience of illustration, only control gate electrodes CG, floating gate electrodes FG, and a semiconductor pillar SP described later are illustrated.

As illustrated in FIG. 1 and FIG. 2, in a nonvolatile semiconductor memory device 1 (hereinafter may be referred to simply as "device 1") according to this embodiment, a plurality of interlayer insulating films ILD and a plurality of control gate electrodes CG are alternately stacked on a substrate (not illustrated) to form a stacked body ML. A through-hole H extending in the stacking direction is formed in the stacked body ML. The diameter of the through-hole H is larger than the thickness of each of the interlayer insulating films ILD. A silicon pillar SP is buried in the through-hole H.

A portion of the interlayer insulating films ILD adjacent to the through-hole H is removed, and the interlayer insulating films ILD go back away from the through-hole H. Thereby, a removed portion A in which the interlayer insulating films ILD do not exist is formed in a region between the control gate electrodes CG and around the through-hole H. A floating gate electrode FG is buried in this removed portion A. Thereby, the floating gate electrode FG having a circular shape is provided between the control gate electrodes CG so as to surround the semiconductor pillar SP. As viewed from the stacking direction, the floating gate electrode FG is disposed concentrically with the semiconductor pillar SP.

Further, an insulating film IPD is provided on the side faces of the through-hole H and the removed portion A. Thereby, the insulating film IPD is provided between the semiconductor pillar SP and the floating gate electrode FG, and the control gate electrodes CG and the interlayer insulating films ILD, and insulates the semiconductor pillar SP and the floating gate electrode FG from the control gate electrodes CG. The insulating film IPD is formed thick enough to insulate them from each other.

In addition, an insulating film TOx is provided between the semiconductor pillar SP and the floating gate electrode FG. The insulating film TOx has a film thickness that allows an electron to pass therethrough by the tunnel effect when a voltage not less than a certain level is applied between the semiconductor pillar SP and the floating gate electrode FG.

The electric potentials of the semiconductor pillar SP and the control gate electrodes CG can be each controlled by a peripheral circuit (not illustrated). Thereby, in the device 1, the electric potentials of the semiconductor pillar SP and the control gate electrodes CG are controlled to transfer an electron between the semiconductor pillar SP and the floating gate electrode FG, and thus a charge can be stored in an optional floating gate electrode FG. Consequently, data can be memorized in the floating gate electrode FG. That is, in the device 1, a memory cell is configured for each floating gate electrode FG.

As viewed from the stacking direction of the stacked body ML, a plurality of through-holes H are arranged in a matrix form in the stacked body ML. As described above, the semiconductor pillar SP, the floating gate electrodes FG, the insulating film IPD, and the insulating film TOx are provided in and around each of the through-holes H. Thereby, in the device 1, a plurality of memory cells are arranged in a three-dimensional matrix form.

In other words, in the device 1, the semiconductor pillar SP, a plurality of the control gate electrodes CG provided around the semiconductor pillar SP, and a plurality of the floating gate electrodes FG provided around the semiconductor pillar SP are provided. The semiconductor pillar SP, the control gate electrodes CG, and the floating gate electrode FG are isolated from each other via the interlayer insulating films ILD, the insulating film IPD, and the insulating film TOx. The control gate electrodes CG and the floating gate electrodes FG are alternately arranged in the direction in which the semiconductor pillar SP extends. The diameter of the semiconductor pillar SP is larger than the thickness of the floating gate electrode FG in the direction in which the semiconductor pillar SP extends.

Hereinbelow, an example of material that forms each member is illustrated.

The control gate electrodes CG are formed of a conductive material such as polysilicon into which impurities are introduced or a metal. The interlayer insulating films ILD, the insulating film IPD, and the insulating film TOx are formed of an insulating material such as silicon oxide. The floating gate electrode FG is formed of silicon. The semiconductor pillar SP is formed of a semiconductor material such as polysilicon into which impurities are introduced.

Next, a method for manufacturing the nonvolatile semiconductor memory device according to this example will now be described.

First, as illustrated in FIG. 1, a plurality of interlayer insulating films ILD and a plurality of control gate electrodes CG are alternately stacked on a substrate (not illustrated) to form a stacked body ML. Next, a through-hole H extending in the stacking direction of the stacked body ML is formed in the stacked body ML. At this time, the diameter of the through-hole H is made larger than the thickness of each of the interlayer insulating films ILD.

Next, a portion of the interlayer insulating films ILD facing the through-hole H is etched via the through-hole H to remove this portion in a circular shape. Thereby, a removed portion A of the interlayer insulating films ILD is formed between control gate electrodes CG.

Next, an insulating film IPD is formed on the inner faces of the through-hole H and the removed portion A. The film thickness of the insulating film IPD is made enough to ensure insulation properties. Next, a floating gate electrode FG made of silicon is buried in the removed portion A. Then, an insulating film TOx is formed so as to cover a portion of the floating gate electrode FG facing the through-hole H. The film thickness of the insulating film TOx is made enough for a tunnel current to flow under certain conditions. Next, a semiconductor pillar SP made of, for example, silicon is buried in the through-hole H. Thereby, the nonvolatile semiconductor memory device 1 according to this embodiment is manufactured.

Next, the operation of the nonvolatile semiconductor memory device 1 according to this embodiment will now be described.

As illustrated in FIG. 1, in the case of writing data in an optional floating gate electrode FG, the electric potentials of one pair of control gate electrodes CG that are disposed on both sides of this floating gate electrode FG are set higher than the electric potential of the semiconductor pillar SP, i.e., a channel. Thereby, the electric potential of the floating gate electrode FG increases due to the coupling effect, and an electron is injected from the semiconductor pillar SP into the floating gate electrode FG via the insulating film TOx by the tunnel effect. The injected electron is stored in the floating gate electrode FG. Thus, data are written in this floating gate electrode FG.

In the case of erasing data written in the floating gate electrode FG, the electric potential of the semiconductor pillar SP is set higher than the electric potential of the floating gate electrode FG. Thereby, the electron stored in the floating gate electrode FG is extracted into the semiconductor pillar SP by the tunnel effect, and the data are erased.

In the case of reading out data written in an optional floating gate electrode FG, the electric potentials of the control gate electrodes CG on both sides of this floating gate electrode FG are set appropriately so that whether or not a current flows in the semiconductor pillar SP may depend on whether or not an electron is stored in the floating gate electrode. The electric potentials of other control gate electrodes CG penetrated by the semiconductor pillar SP which penetrates the control gate electrodes CG mentioned above are set appropriately so that a current may flow in the semiconductor pillar SP regardless of whether or not an electron is stored in the other floating gate electrodes FG. In this state, a voltage is applied to both ends of the semiconductor pillar SP to detect whether or not a current flows in the semiconductor pillar SP. Thereby, the data written in this floating gate electrode FG can be read out.

Next, effects of this embodiment will now be described.

As described above, in the nonvolatile semiconductor memory device according to this embodiment, a plurality of memory cells are arranged in a three-dimensional matrix form. Thereby, the integration degree of memory cells per unit area can be made high. Furthermore, since through-holes H are processed collectively in the stacked body ML, an increase in manufacturing cost can be suppressed even if the number of stacked layers increases.

Furthermore, in this embodiment, each memory cell is configured by the floating gate electrode FG, and data are memorized by storing an electron in the floating gate electrode FG. The electron stored in the floating gate electrode FG is extracted into the semiconductor pillar SP by the tunnel effect, and thereby the data are erased from the floating gate electrode FG. Since the tunnel current by an electron is larger than the tunnel current by a hole if the applied voltage is the same, the device 1 achieves high erasing speeds.

Furthermore, in this embodiment, the electric potential of the floating gate electrode FG is controlled by controlling the electric potentials of control gate electrodes CG. Since the control gate electrodes CG are disposed on both sides of a floating gate electrode FG, the rate of coupling between the control gate electrodes CG and the floating gate electrode FG is high. Therefore, the driving electric potential has a wide margin. Consequently, the electric potentials of the control gate electrodes CG can be kept low, for example, and this embodiment is suitable for miniaturization.

Furthermore, in this embodiment, the floating gate electrode FG is formed of silicon, which has a narrower band gap than silicon oxide that forms the insulating film IPD and the insulating film TOx. Therefore, the floating gate electrode FG can retain injected electrons stably.

Furthermore, in this embodiment, floating gate electrodes FG are away from each other. Therefore, an electron that has once been stored in the floating gate electrode FG does not move to an adjacent floating gate electrode FG. Thereby, fluctuation in the threshold of a memory cell due to the movement of electrons between memory cells does not occur.

Thus, according to this embodiment, a memory cell is configured by the floating gate electrode in a nonvolatile semiconductor memory device of three-dimensional stacked type that is manufactured by collective processing. Thereby, characteristics close to those of conventional planar NAND type memories can be achieved with respect to erasing speed and charge retention properties, and interference between memory cells can be prevented, serving to ensure the reliability of data.

In contrast, in a memory device of three-dimensional stacked type in which the memory cell is configured by a MONOS type transistor, the integration rate per unit area can be increased by integrating memory cells three-dimensionally, and the manufacturing cost can be reduced by collective processing. However, since electrons are stored in a silicon nitride film that is continuously formed on the inner face of a through-hole, there is a problem that the erasing speed is slow and interference between memory cells easily occurs.

More specifically, when erasing data written in a memory cell, it is necessary to inject a hole into the silicon nitride film to cause pair annihilation with an electron that is stored in the silicon nitride film. However, since the tunnel current by a hole is smaller than the tunnel current by an electron if the applied voltage is the same, the erasing speed is slow. Furthermore, since the control gate electrode is disposed only on one side of the silicon nitride film, the coupling rate is low and the operating margin is narrow. Furthermore, although the band gap of silicon nitride is narrower than the band gap of silicon oxide, it is wider than the band gap of silicon. Therefore, the charge retention properties are low. Moreover, there is a possibility that an electron injected into a memory cell is affected by the electric potential of an adjacent memory cell and thus moves in the silicon nitride film by hopping conduction. Accordingly, the threshold of the MONOS type transistor that forms a memory cell may fluctuate.

Next, a second embodiment of the invention will now be described.

Figure 3:
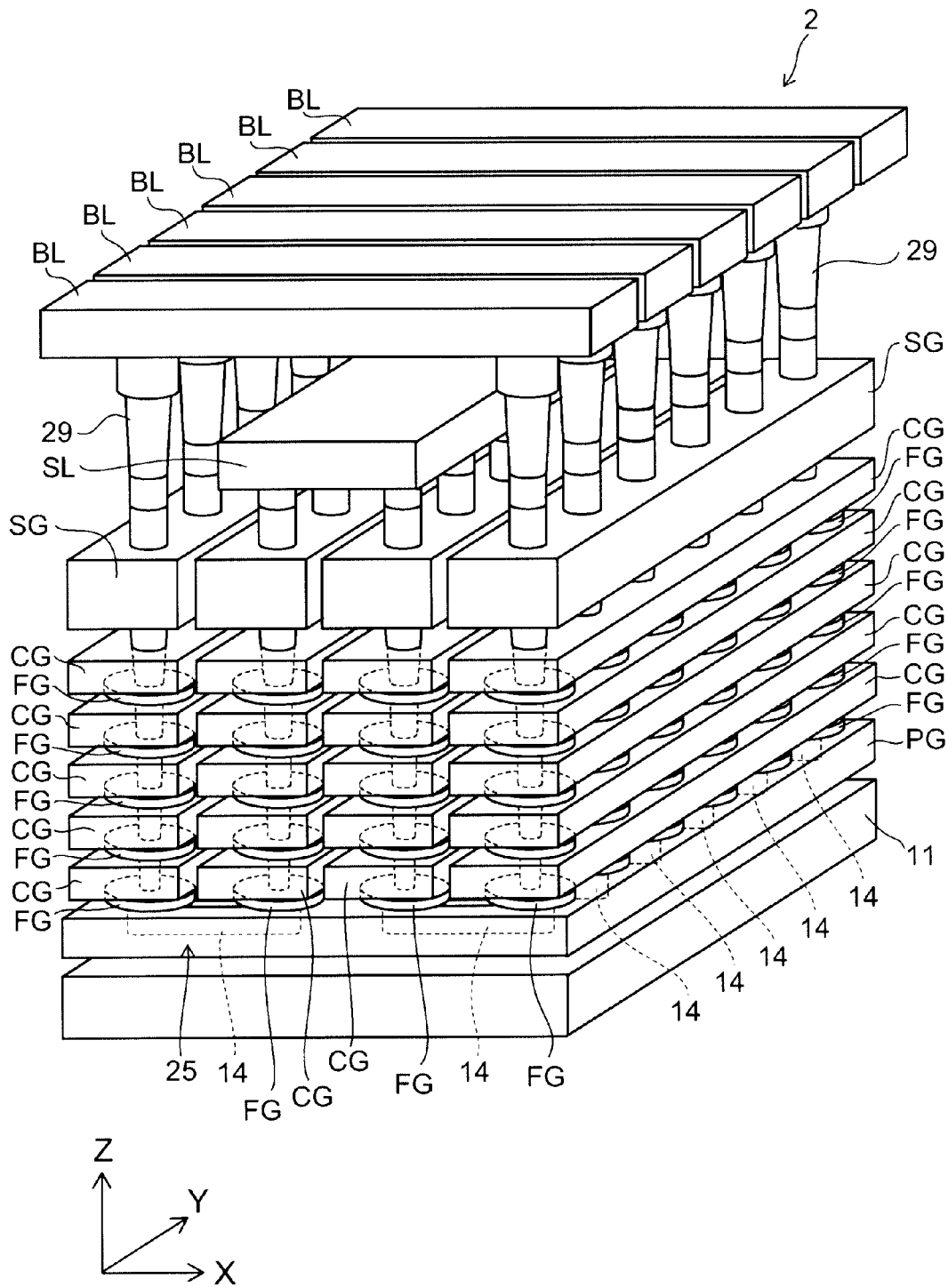
FIG. 3 is a perspective view illustrating a nonvolatile semiconductor memory device according to a second embodiment of the invention.

FIG. 3 is a perspective view illustrating a nonvolatile semiconductor memory device according to this embodiment.

Figure 4:
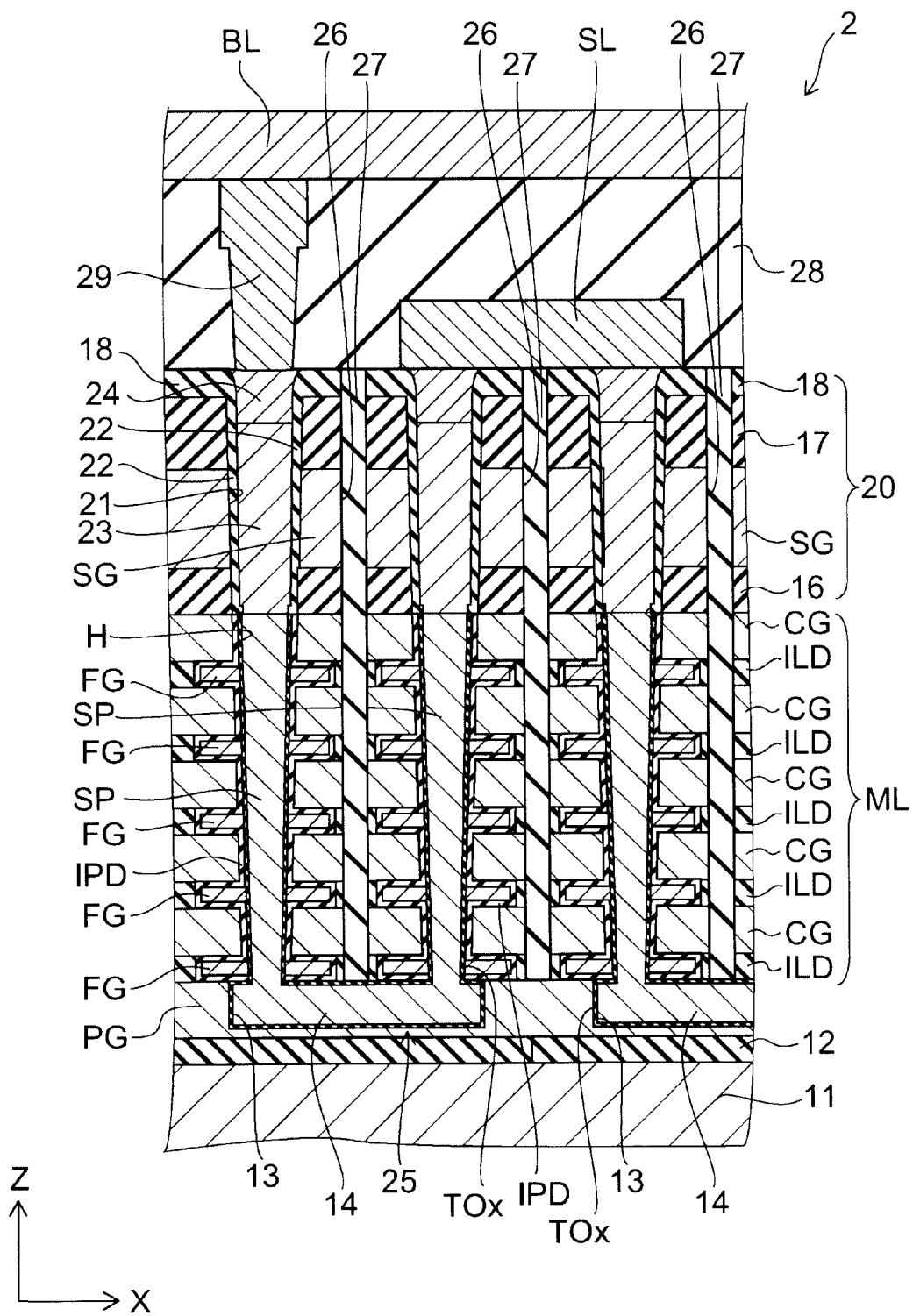
FIG. 4 is a cross-sectional view illustrating a nonvolatile semiconductor memory device according to the second embodiment.

FIG. 4 is a cross-sectional view illustrating a nonvolatile semiconductor memory device according to this embodiment.

In FIG. 3, for convenience of illustration, only a part of the conductive portions and the semiconductor portions is illustrated and the insulating portions are omitted.

This embodiment is an embodiment that embodies the first embodiment described above in an aspect closer to the actual devices. Effects of this embodiment are like the first embodiment described above.

As illustrated in FIG. 3 and FIG. 4, in a nonvolatile semiconductor memory device 2 according to this embodiment, a silicon substrate 11 made of, for example, single-crystal silicon is provided. An insulating film 12 made of, for example, silicon oxide is provided on the silicon substrate 11, and a conductive film PG made of, for example, polysilicon is provided thereon. Concaves 13 are provided at the top face of the conductive film PG, and a connection member 14 made of, for example, polysilicon having N-type conductivity is buried in the concave 13.

A plurality of interlayer insulating films ILD and a plurality of control gate electrodes CG are alternately stacked layer by layer on the conductive film PG, and thereby a stacked body ML is formed. The configuration of the stacked body ML is like the first embodiment described above. That is, a plurality of through-holes H are formed in the stacked body ML in a matrix form as viewed from the stacking direction, and a semiconductor pillar SP made of polysilicon having N-type conductivity is buried in each of the through-holes H. The diameter of the through-hole H is larger than the thickness of each of the interlayer insulating films ILD.

A portion of the interlayer insulating films ILD around the through-hole H goes back to form a removed portion A of the interlayer insulating films ILD. A floating gate electrode FG is buried in the removed portion A. The floating gate electrode FG is formed of polysilicon having $N^+$-type conductivity, and has a circular shape surrounding the semiconductor pillar SP. Further, the semiconductor pillar SP and the floating gate electrode FG are insulated from the control gate electrodes CG by an insulating film IPD, and an insulating film TOx is provided between the floating gate electrode FG and the semiconductor pillar SP. The insulating film TOx is provided also on the inner face of the concave 13 of the conductive film PG and insulates the connection member 14 from the conductive film PG.

Hereinbelow, for convenience of description, an XYZ orthogonal coordinate system is used in this embodiment. In this coordinate system, two directions parallel to the top face of the silicon substrate 11 and orthogonal to each other are defined as an X direction and a Y direction, and the direction orthogonal to both the X direction and the Y direction, that is, the stacking direction of the layers described above is defined as a Z direction.

The connection member 14 has a shape of rectangular parallelepiped extending in the X direction. The top faces of both ends of the connection member 14 are each connected to the lower end of the semiconductor pillar SP. Thereby, two semiconductor pillars SP that are adjacent to each other in the X direction are connected to each other via the connection member 14.

An insulating film 16 made of, for example, silicon oxide is provided on the stacked body ML, and thereon selection gate electrodes SG made of a conductive material such as polysilicon into which impurities are introduced are provided. An insulating film 17 made of, for example, silicon oxide and an insulating film 18 made of, for example, silicon oxide are provided on the selection gate electrodes SG. An upper gate stacked body 20 is configured by the insulating film 16, the selection gate electrodes SG, the insulating film 17, and the insulating film 18. Through-holes 21 extending in the Z direction (stacking direction) are formed in this upper gate stacked body 20. The through-holes 21 are formed immediately above the through-holes H and communicate with the through-holes H.

A gate insulating film 22 made of, for example, silicon oxide is formed on the side face of the through-hole 21. Polysilicon into which impurities are introduced, for example, is buried in the lower portion of the through-hole 21, that is, the portion surrounded by the insulating film 16, the selection gate electrode SG, and the lower portion of the insulating film 17, and this forms a semiconductor pillar 23. Further, a metal material is buried in the upper portion of the through-hole 21, that is, the portion surrounded by the insulating film 18 and the upper portion of the insulating film 17, and this forms a plug 24. The semiconductor pillar SP, the semiconductor pillar 23, and the plug 24 that are arranged in the Z direction are connected to each other.

Slits 26 extending in the Y direction are formed from above in the stacked body ML and the upper gate stacked body 20. The slits 26 are formed in regions between through-holes that are arranged in the X direction, and divide the lowermost control gate electrode CG but do not divide the connection member 14. An insulating member 27 made of, for example, silicon oxide is buried in the slit 26. Thereby, the control gate electrodes CG and the selection gate electrodes SG are divided along the X direction to be shaped into stripes extending in the Y direction. Each control gate electrode CG and each selection gate electrode SG correspond to each column of semiconductor pillars SP and 23 that are arranged along the Y direction.

A source line SL made of, for example, a metal is formed on the upper gate stacked body 20. The source line SL has a stripe shape extending in the Y direction, and has a width greater than the widths of the control gate electrode CG and the selection gate electrode SG. The source line SL is connected to semiconductor pillars 23 that are arranged in two columns extending along the Y direction, via plugs 24. Each of the two columns of semiconductor pillars that are connected to one source line SL is connected to a mutually-different connection member 14. On the other hand, one column of semiconductor pillars out of the two columns of semiconductor pillars that are connected to one connection member 14 is connected to a common source line SL, and the other column of semiconductor pillars is not connected to any source lines SL.

An insulating film 28 made of, for example, silicon oxide is provided on the upper gate stacked body 20 so as to bury the source line SL. In the insulating film 28, a plug 29 is buried immediately above the semiconductor pillar that is not connected to the source line SL. Bit lines BL extending in the X direction are formed on the insulating film 28 and are connected to plugs 29.

Thereby, a U-shaped pillar 25 that is composed of the plug 29, the plug 24, the semiconductor pillar 23, the semiconductor pillar SP, the connection member 14, the semiconductor pillar SP, the semiconductor pillar 23, and the plug 24 is formed between the bit line BL and the source line SL. In each U-shaped pillar 25, the connection member 14 and one pair of semiconductor pillars SP connected thereto are integrally formed.

Next, a method for manufacturing the nonvolatile semiconductor memory device according to this embodiment will now be described.

FIGS. 5 to 16 are process cross-sectional views illustrating a method for manufacturing the nonvolatile semiconductor memory device according to this embodiment.

Figure 5:
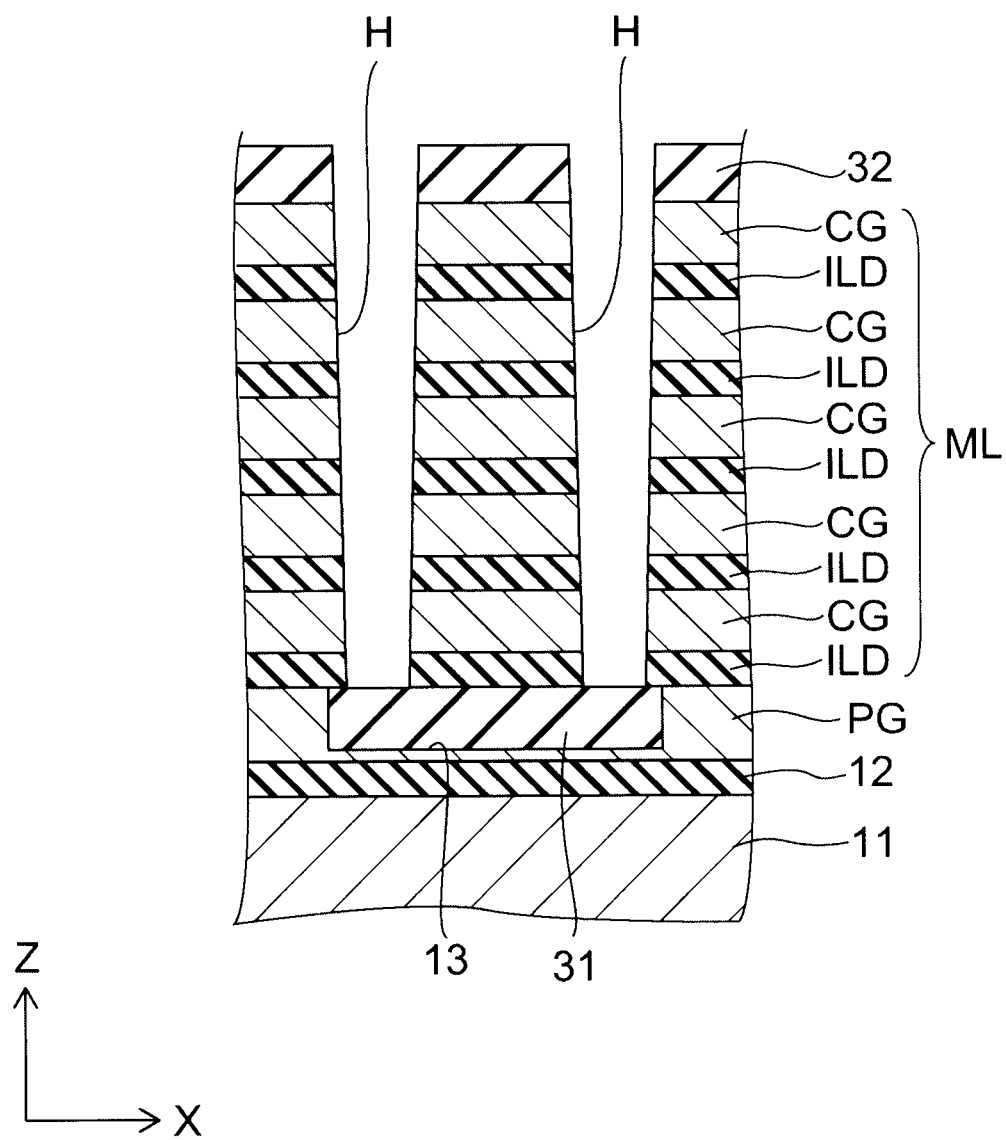
FIG. 5 is a flow cross-sectional view illustrating a method for manufacturing a nonvolatile semiconductor memory device according to the second embodiment.

First, as illustrated in FIG. 5, an insulating film 12 made of, for example, silicon oxide is formed on a silicon substrate 11 made of, for example, single-crystal silicon. Amorphous silicon into which phosphorus (P), for example, is introduced is deposited thereon to form a conductive film PG. Then, concaves 13 having a strip shape extending in the X direction are formed on the top face of the conductive film PG, and a sacrifice member 31 made of silicon nitride is buried in each of the concaves 13.

Then, interlayer insulating films ILD made of silicon oxide and control gate electrodes CG made of amorphous silicon into which phosphorus is introduced are alternately stacked on the conductive film PG to form a stacked body ML. After that, a silicon oxide film 32 is formed on the stacked body ML. Next, etching is performed from above on the silicon oxide film 32 and the stacked body ML to form through-holes H extending in the Z direction in the stacked body ML, so that the through-holes H may reach both ends of the sacrifice member 31. At this time, the through-holes H are formed in a matrix form as viewed from the Z direction. The diameter of the through-hole H is made larger than the thickness of each of the interlayer insulating films ILD.

Figure 6:
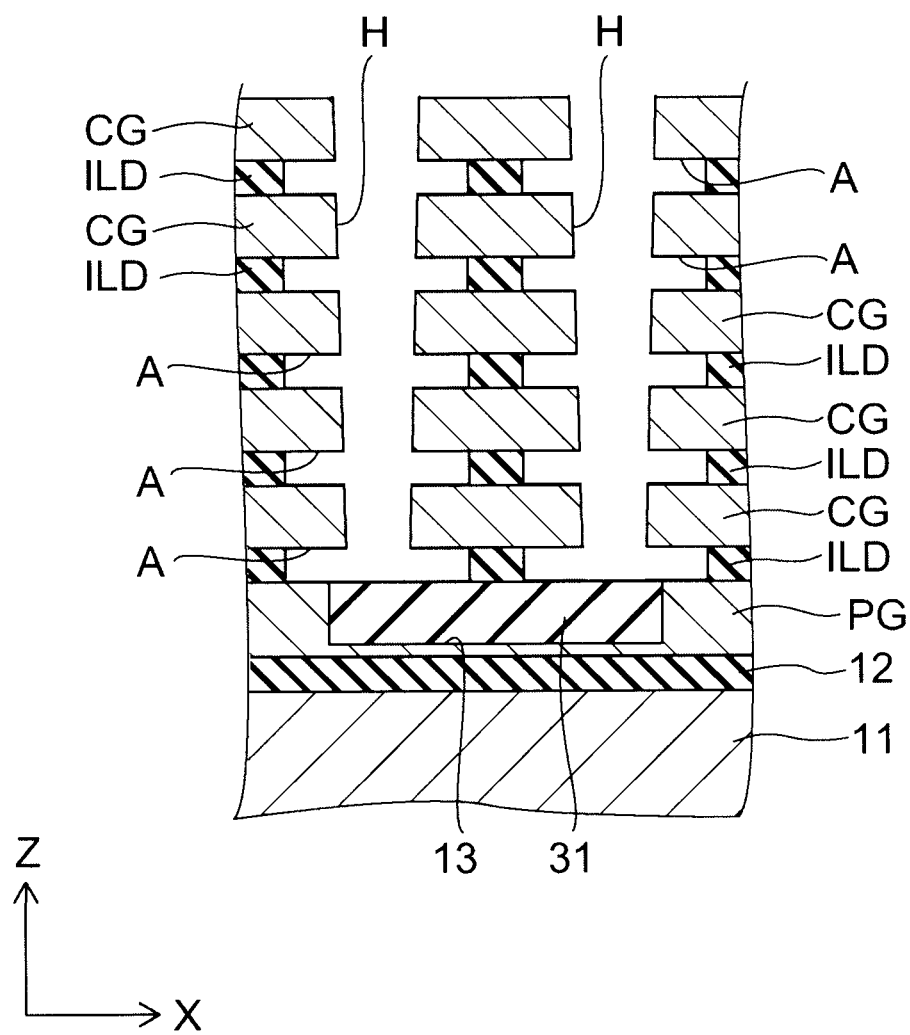
FIG. 6 is a flow cross-sectional view illustrating a method for manufacturing a nonvolatile semiconductor memory device according to the second embodiment.

Next, as illustrated in FIG. 6, wet etching using dilute hydrofluoric acid and the like is performed. Thereby, a portion of the interlayer insulating films ILD facing the through-hole H is etched via the through-hole H, and thus the portion is removed in a circular shape around the through-hole H. Consequently, a removed portion A having a circular shape that communicates with the through-hole H is formed between the control gate electrodes CG. At this time, the uppermost silicon oxide film 32 (see FIG. 5) also is removed.

Figure 7:
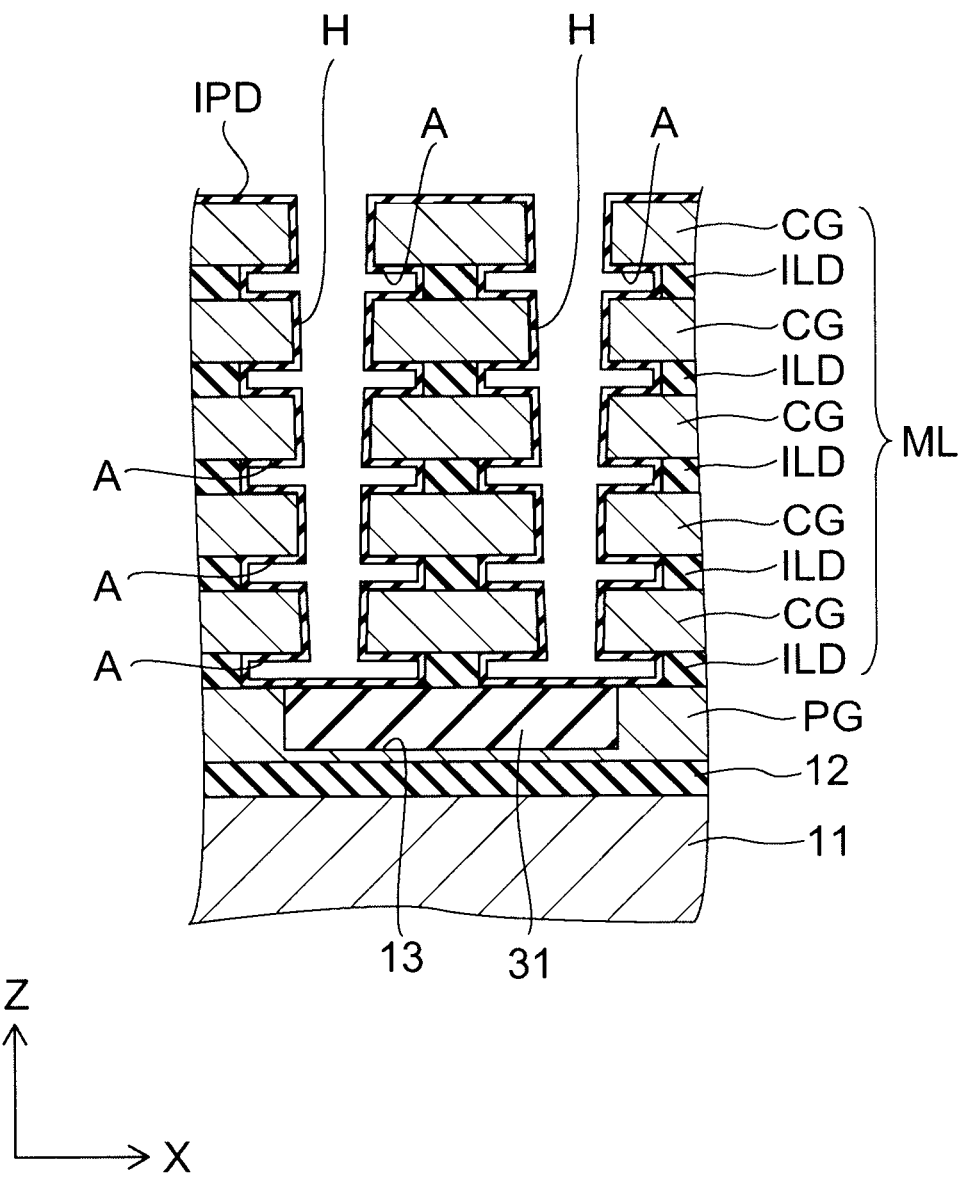
FIG. 7 is a flow cross-sectional view illustrating a method for manufacturing a nonvolatile semiconductor memory device according to the second embodiment.

Next, as illustrated in FIG. 7, silicon oxide is thinly deposited over the entire surface by, for example, LPCVD (low pressure chemical vapor deposition). Thereby, an insulating film IPD made of silicon oxide is formed over the entire exposed surface. The insulating film IPD is formed on the inner faces of the through-hole H and the removed portion A, and is formed also on the top face of the stacked body ML and on the top face of the sacrifice member 31.

Figure 8:
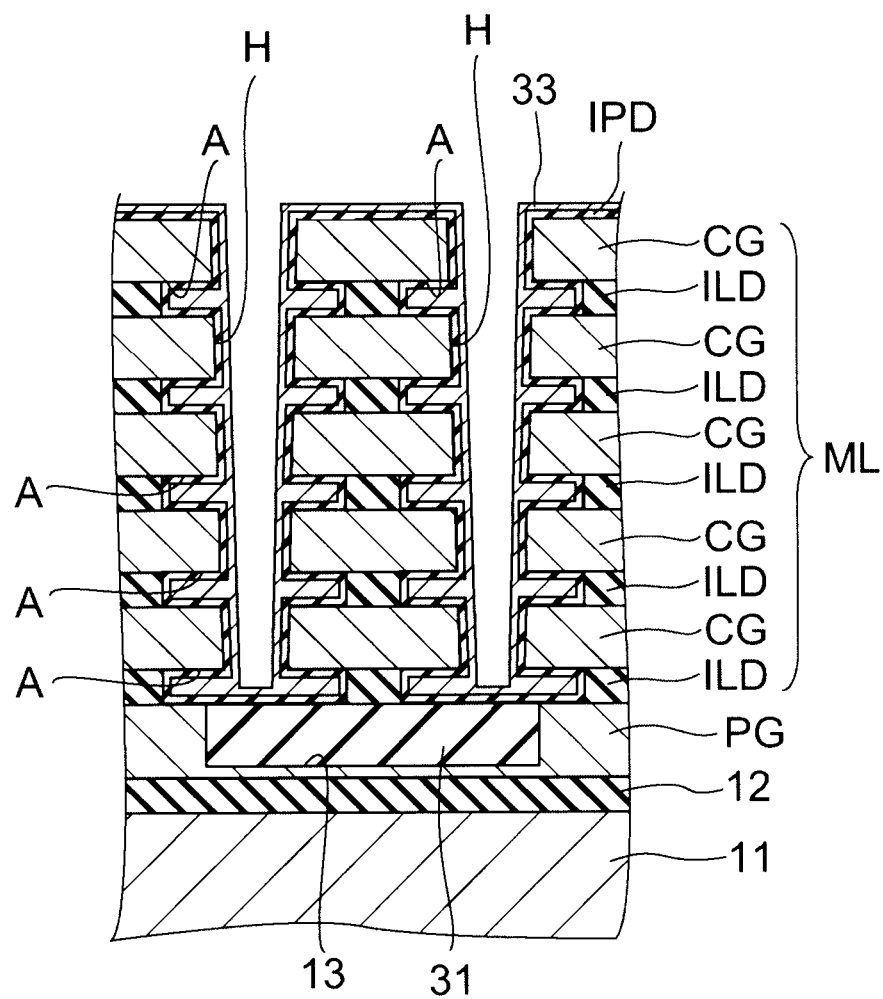
FIG. 8 is a flow cross-sectional view illustrating a method for manufacturing a nonvolatile semiconductor memory device according to the second embodiment.

Next, as illustrated in FIG. 8, amorphous silicon having $N^+$-type conductivity is thinly deposited by, for example, LPCVD to form a silicon layer 33 over the entire exposed surface. At this time, the amorphous silicon is deposited in an appropriate amount so that the removed portion A of the interlayer insulating films ILD may be completely filled up with the silicon layer 33, but the inside of the through-hole H may not be completely filled up with the silicon layer 33. Since the diameter of the through-hole H is larger than the thickness of the interlayer insulating films ILD, that is, the height of the removed portion A, such setting of the deposition amount is possible.

Figure 9:
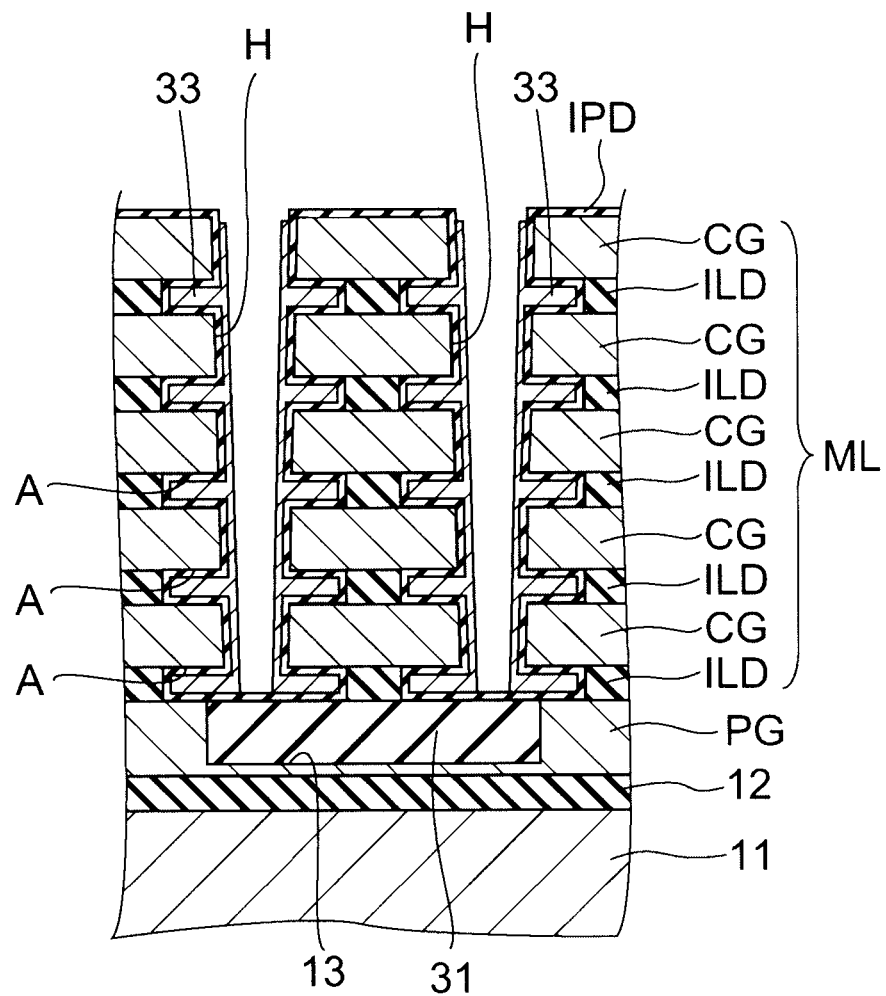
FIG. 9 is a flow cross-sectional view illustrating a method for manufacturing a nonvolatile semiconductor memory device according to the second embodiment.

Next, as illustrated in FIG. 9, anisotropic etching such as RIE (reactive ion etching) is performed to remove the silicon layer 33 deposited on the bottom face of the through-hole H. At this time, the silicon layer 33 deposited on the top face of the stacked body ML also is removed.

Figure 10:
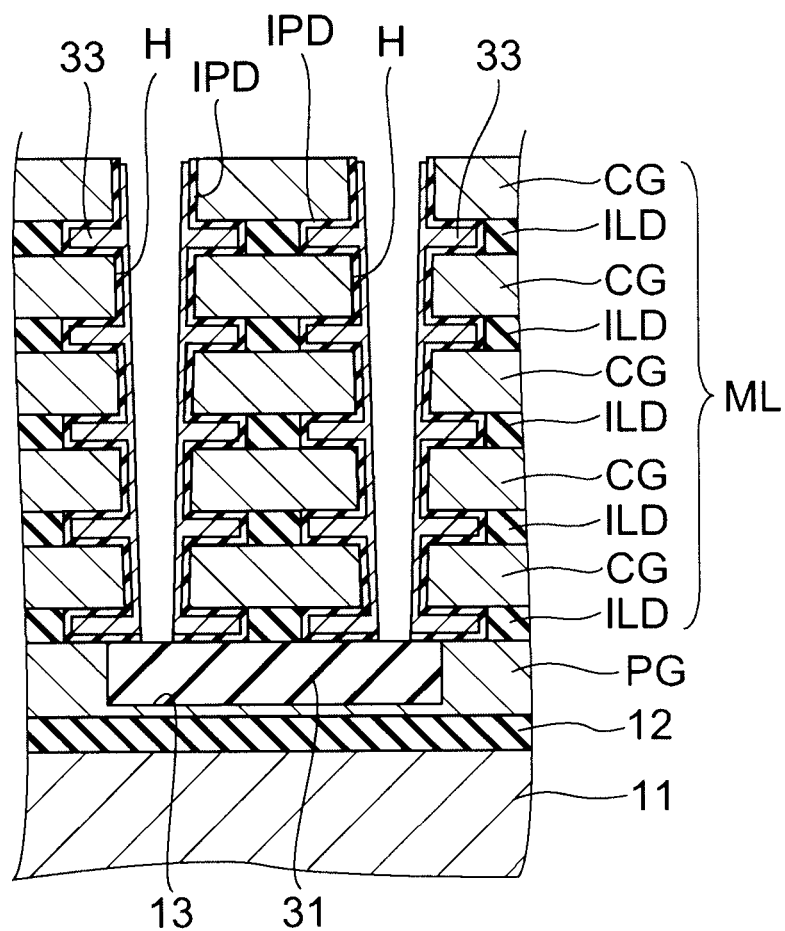
FIG. 10 is a flow cross-sectional view illustrating a method for manufacturing a nonvolatile semiconductor memory device according to the second embodiment.

Next, as illustrated in FIG. 10, RIE is performed over the entire surface to remove the insulating film IPD from the bottom face of the through-hole H. At this time, the insulating film IPD deposited on the top face of the stacked body ML also is removed.

Figure 11:
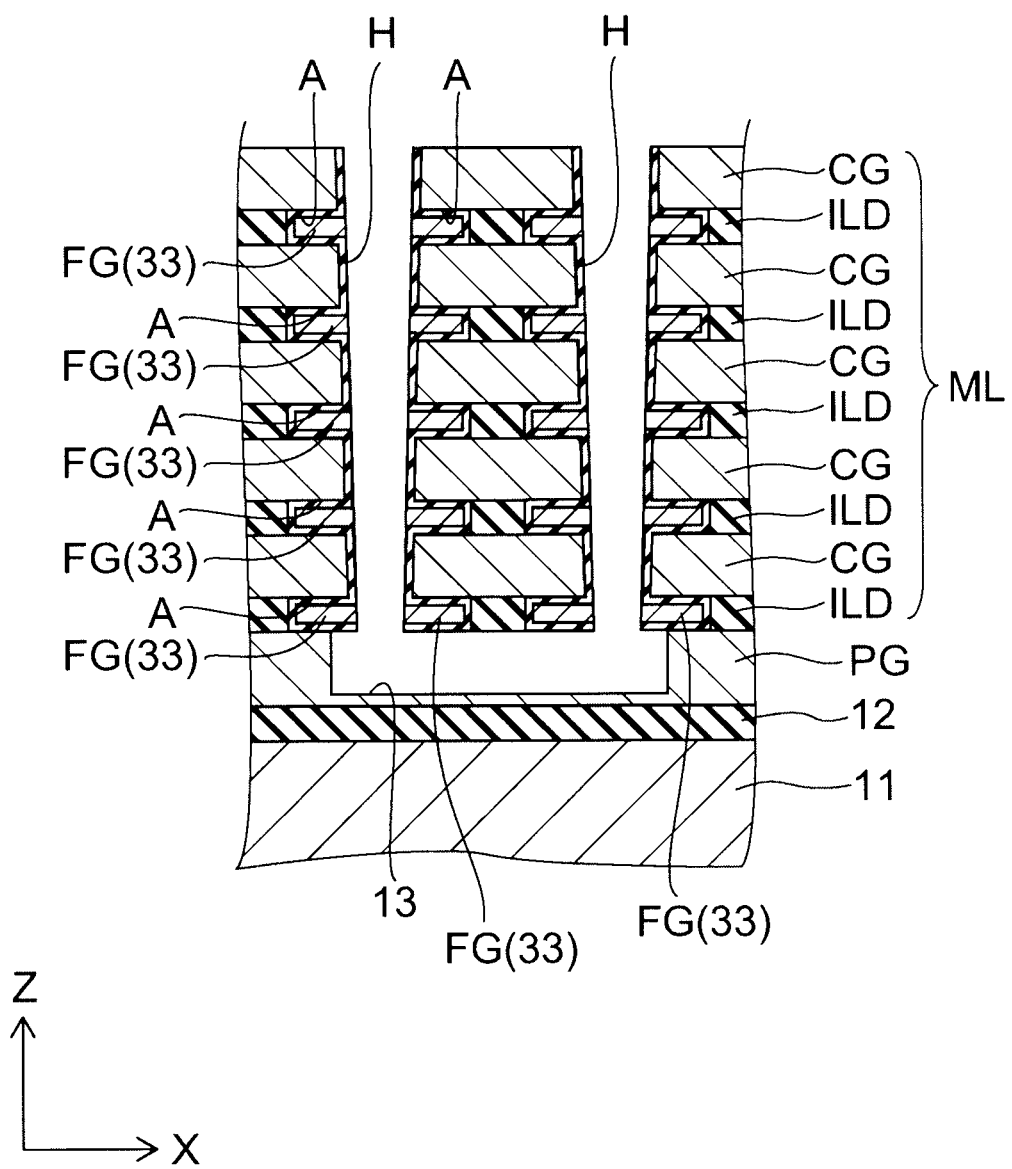
FIG. 11 is a flow cross-sectional view illustrating a method for manufacturing a nonvolatile semiconductor memory device according to the second embodiment.

Next, as illustrated in FIG. 11, wet etching using hot phosphoric acid is performed to remove the sacrifice member 31 (see FIG. 10) from the concave 13 via the through-hole H. Then, isotropic etching such as CDE (chemical dry etching) is performed to remove the silicon layer 33 from the side face of the through-hole H. At this time, the silicon layer 33 deposited in the removed portion A of the interlayer insulating films ILD is not removed but remains to form the floating gate electrode FG.

Figure 12:
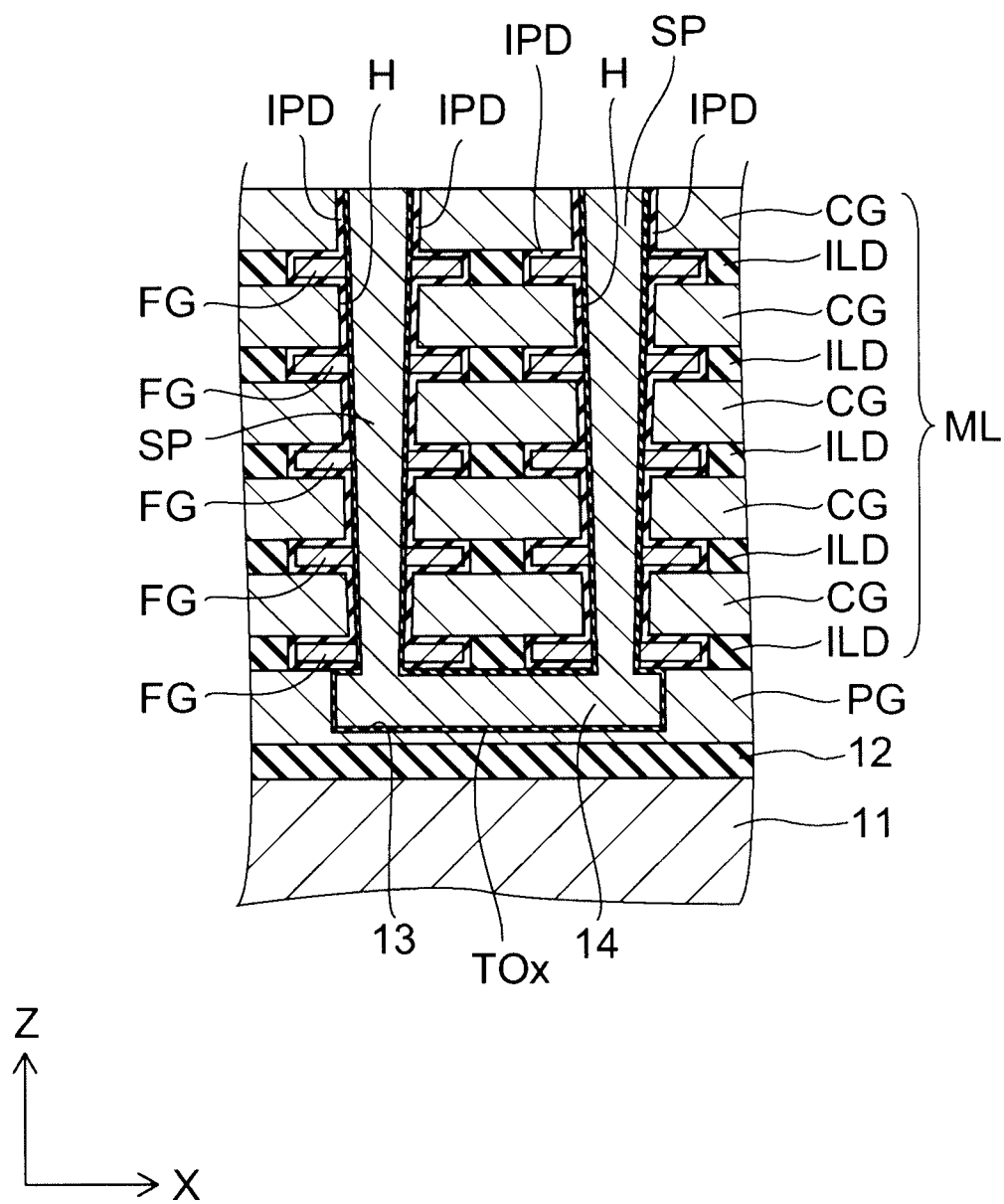
FIG. 12 is a flow cross-sectional view illustrating a method for manufacturing a nonvolatile semiconductor memory device according to the second embodiment.

Next, as illustrated in FIG. 12, a silicon oxide film is thinly deposited by LPCVD, for example. Thereby, an insulating film TOx is formed on a face of the floating gate electrode FG exposed to the through-hole H, on the inner face of the concave 13, and on the insulating film IPD. The insulating film TOx may be formed by thermal oxidation treatment. In this case, the insulating film TOx is not formed on the insulating film IPD.

Next, amorphous silicon having N-type conductivity is deposited over the entire surface to fill up the through-hole H and the concave 13. Thereby, a connection member 14 is formed in the concave 13, and a semiconductor pillar SP is formed in the through-hole H. At this time, one connection member 14 and two semiconductor pillars SP that are connected to both ends of the connection member 14 are integrally formed. Then, the amorphous silicon is removed from the top face of the stacked body ML.

Figure 13:
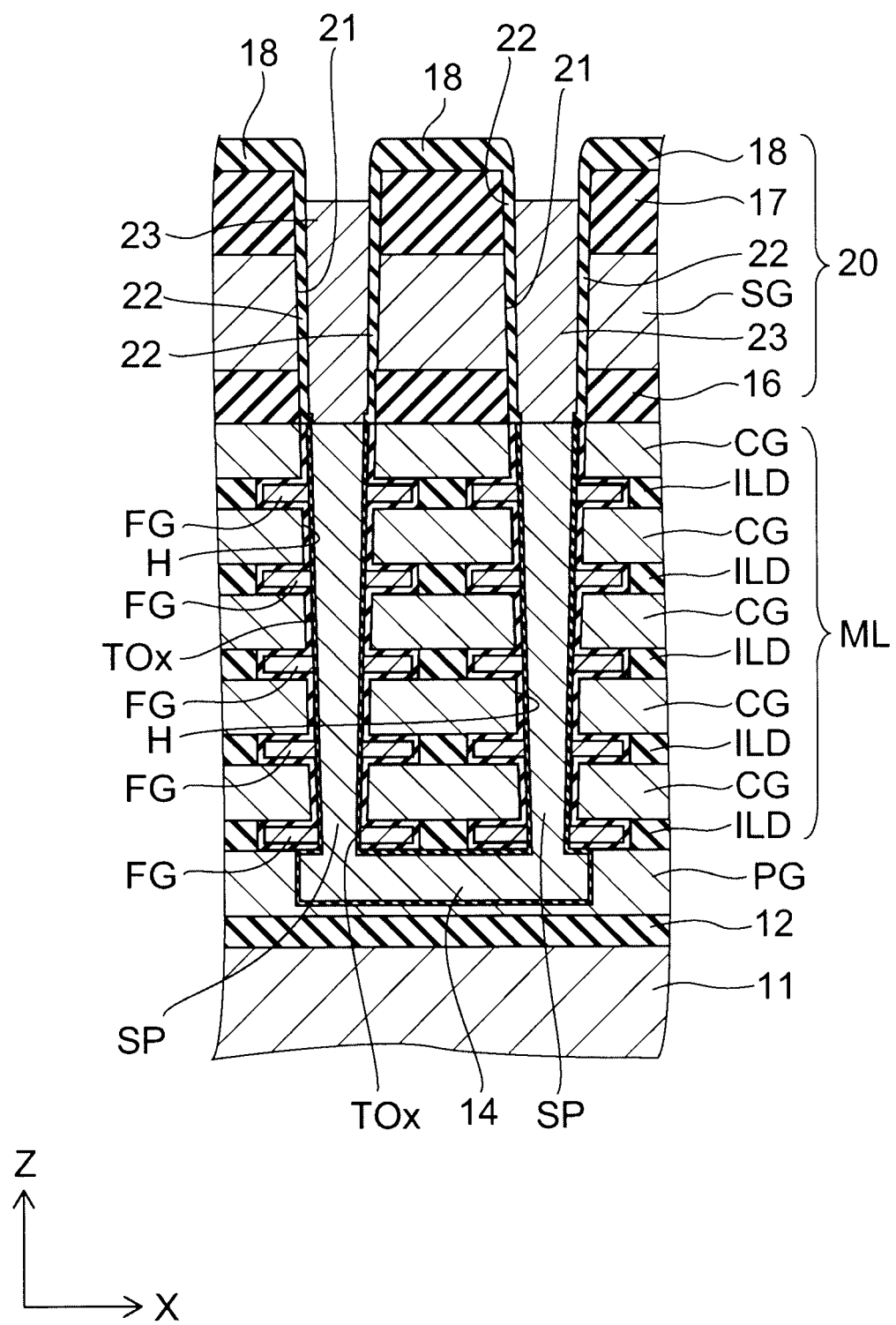
FIG. 13 is a flow cross-sectional view illustrating a method for manufacturing a nonvolatile semiconductor memory device according to the second embodiment.

Next, as illustrated in FIG. 13, silicon oxide is deposited on the stacked body ML to form an insulating film 16; amorphous silicon into which impurities are introduced is deposited to form a selection gate electrode SG; and silicon oxide is deposited to form an insulating film 17. Then, through-holes 21 are formed in regions that are located in the insulating film 16, the selection gate electrode SG, and the insulating film 17, and immediately above the through-holes H by etching such as RIE.

Next, a dielectric material such as silicon oxide is deposited over the entire surface to form a gate insulating film 22 on the side face of the through-hole 21 and to form an insulating film 18 on the dielectric film 17. Then, anisotropic etching such as RIE is performed to remove the gate insulating film 22 from the bottom face of the through-hole 21. Then, amorphous silicon is buried in the lower portion of the through-hole 21, that is, the portion surrounded by the insulating film 16, the selection gate electrode SG, and the lower portion of the insulating film 17 to form a semiconductor pillar 23

Figure 14:
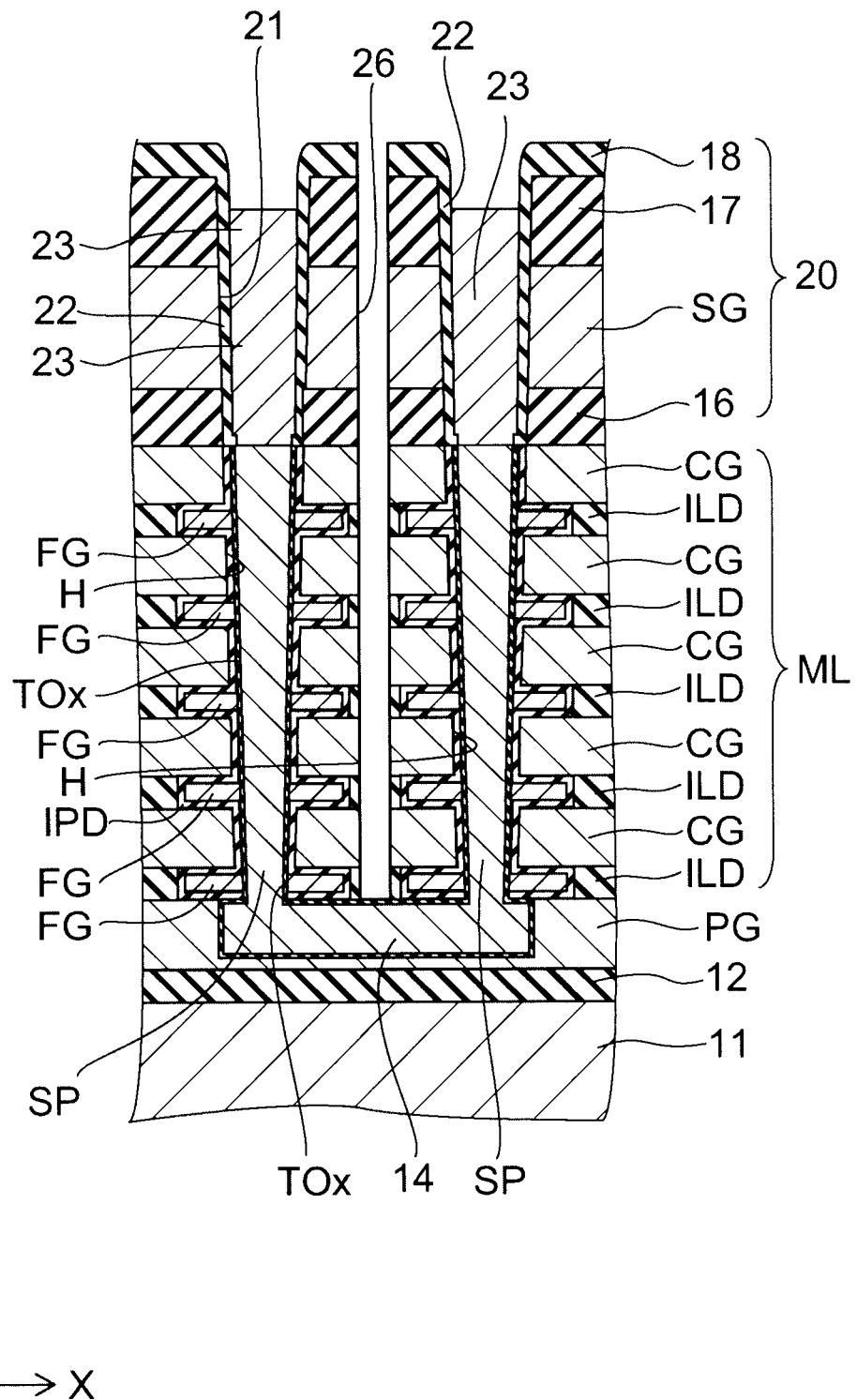
FIG. 14 is a flow cross-sectional view illustrating a method for manufacturing a nonvolatile semiconductor memory device according to the second embodiment.

Next, as illustrated in FIG. 14, a slit 26 extending in the Y direction is formed in the upper gate stacked body 20 and the stacked body ML. The slit 26 is formed between semiconductor pillars that are arranged along the X direction, with an appropriate depth so that the lowermost control gate electrode CG may be divided but the connection member 14 may not be divided. Thereby, the selection gate electrode SG and the control gate electrodes CG are divided along the X direction for each semiconductor pillar, and are shaped into stripes extending in the Y direction.

Figure 15:
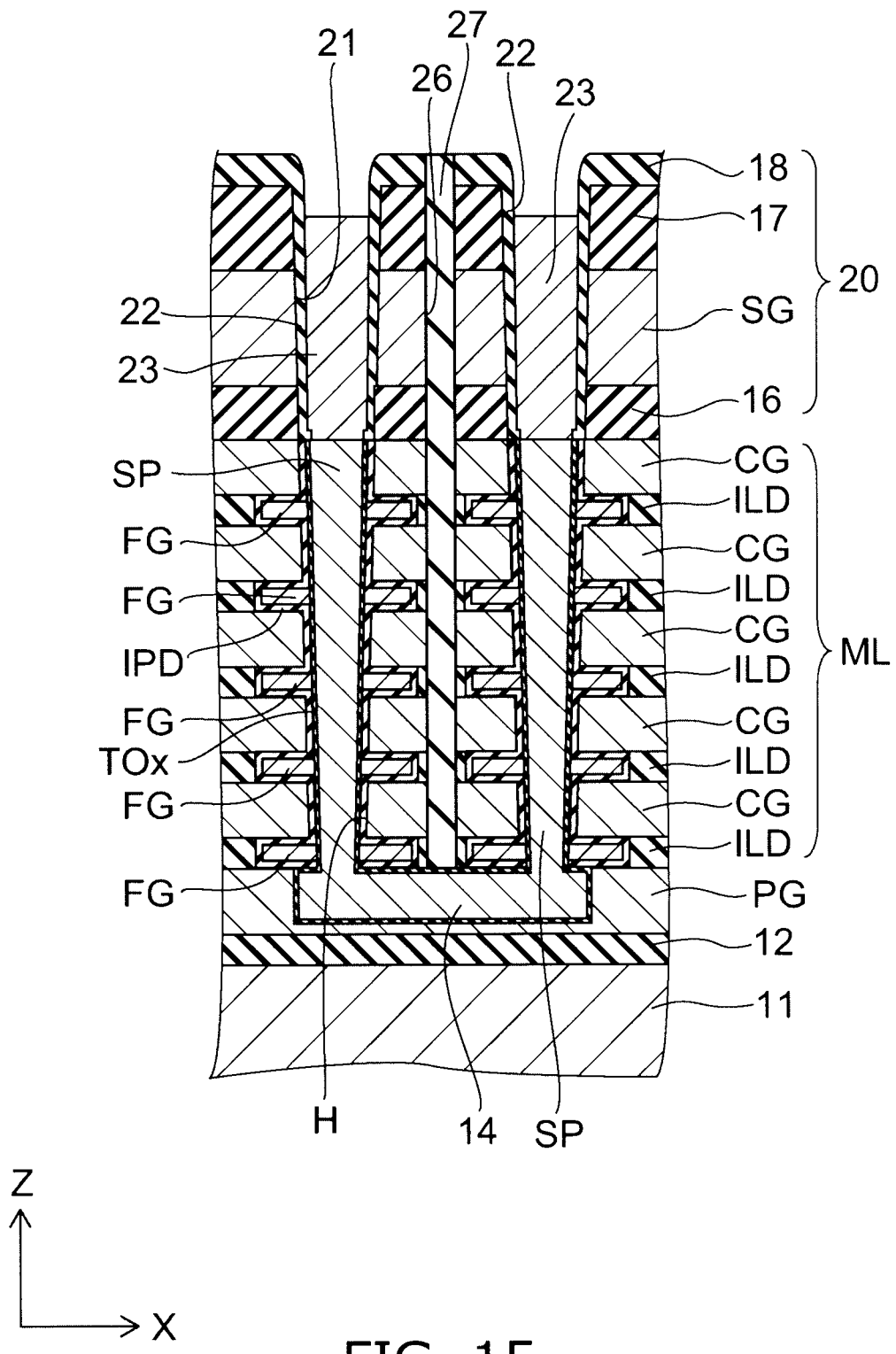
FIG. 15 is a flow cross-sectional view illustrating a method for manufacturing a nonvolatile semiconductor memory device according to the second embodiment.

Next, as illustrated in FIG. 15, silicon oxide is buried in the slit 26 to form an insulating member 27. At this time, a silicide may be formed on the side face of the control gate electrodes CG exposed to the slit 26.

Figure 16:
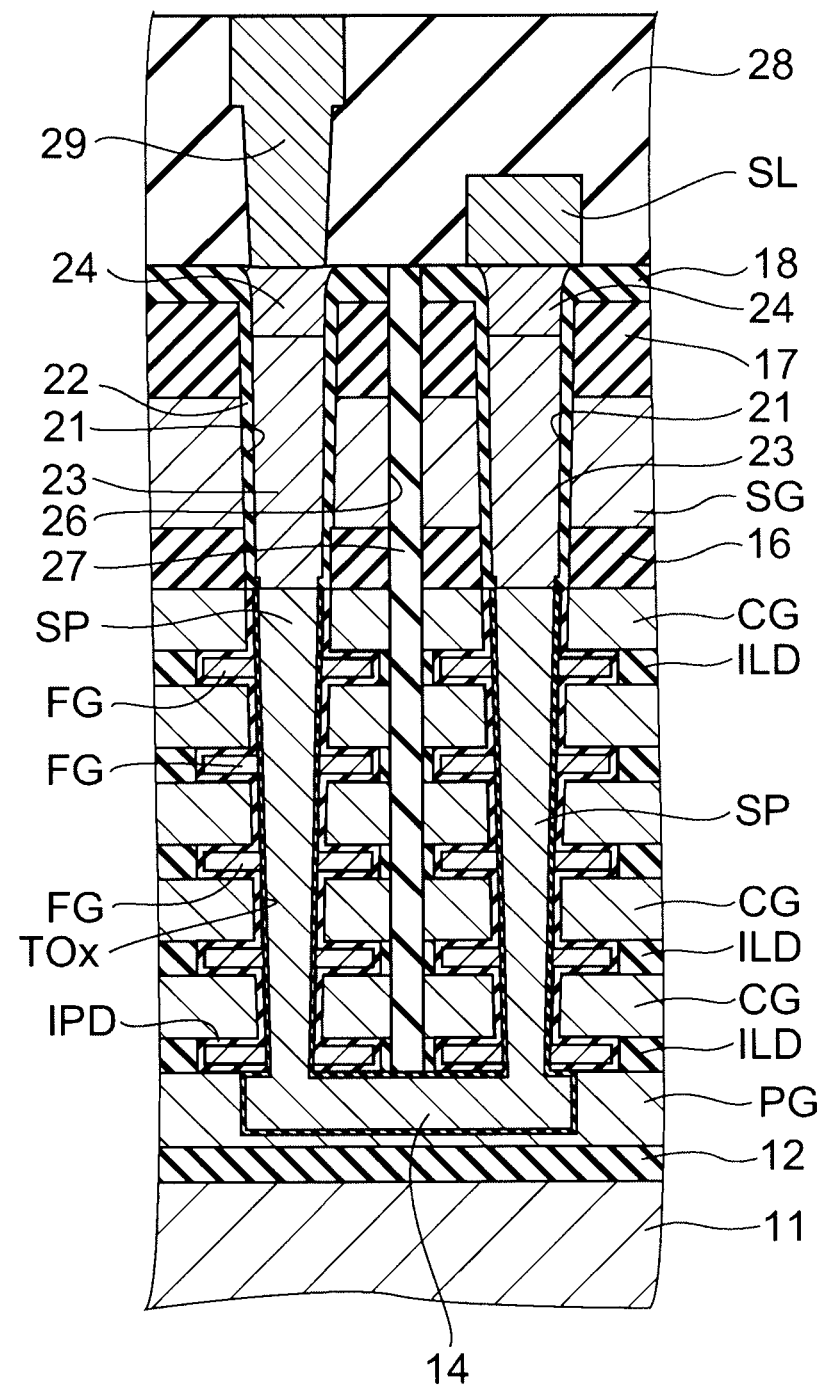
FIG. 16 is a flow cross-sectional view illustrating a method for manufacturing a nonvolatile semiconductor memory device according to the second embodiment.

Next, as illustrated in FIG. 16, a metal is deposited over the entire surface and patterned. Thereby, a plug 24 is buried in the upper portion of the through-hole 21, that is, on the semiconductor pillar 23, and a source line SL extending in the Y direction is formed on the insulating film 18 and the plug 24.

The source line SL is connected to one of the two semiconductor pillars that are connected to each connection member 14. Then, silicon oxide is deposited so as to bury the source line SL to form an insulating film 28. Next, throughholes are formed in the insulating film 28, and plugs 29 made of a metal are buried.

Next, as illustrated in FIG. 4, a bit line BL extending in the X direction is formed on the insulating film 28. The bit line BL is connected to a semiconductor pillar that is not connected to the source line SL, out of two semiconductor pillars that are connected to each connection member 14, via the plug 29. The amorphous silicon deposited at each portion becomes polysilicon by the heat treatments accompanying the processes so far, and thus the impurities are activated. Thus, the nonvolatile semiconductor memory device 2 is manufactured.

Next, the operation of the nonvolatile semiconductor memory device 2 according to this embodiment will now be described.

Figure 17:
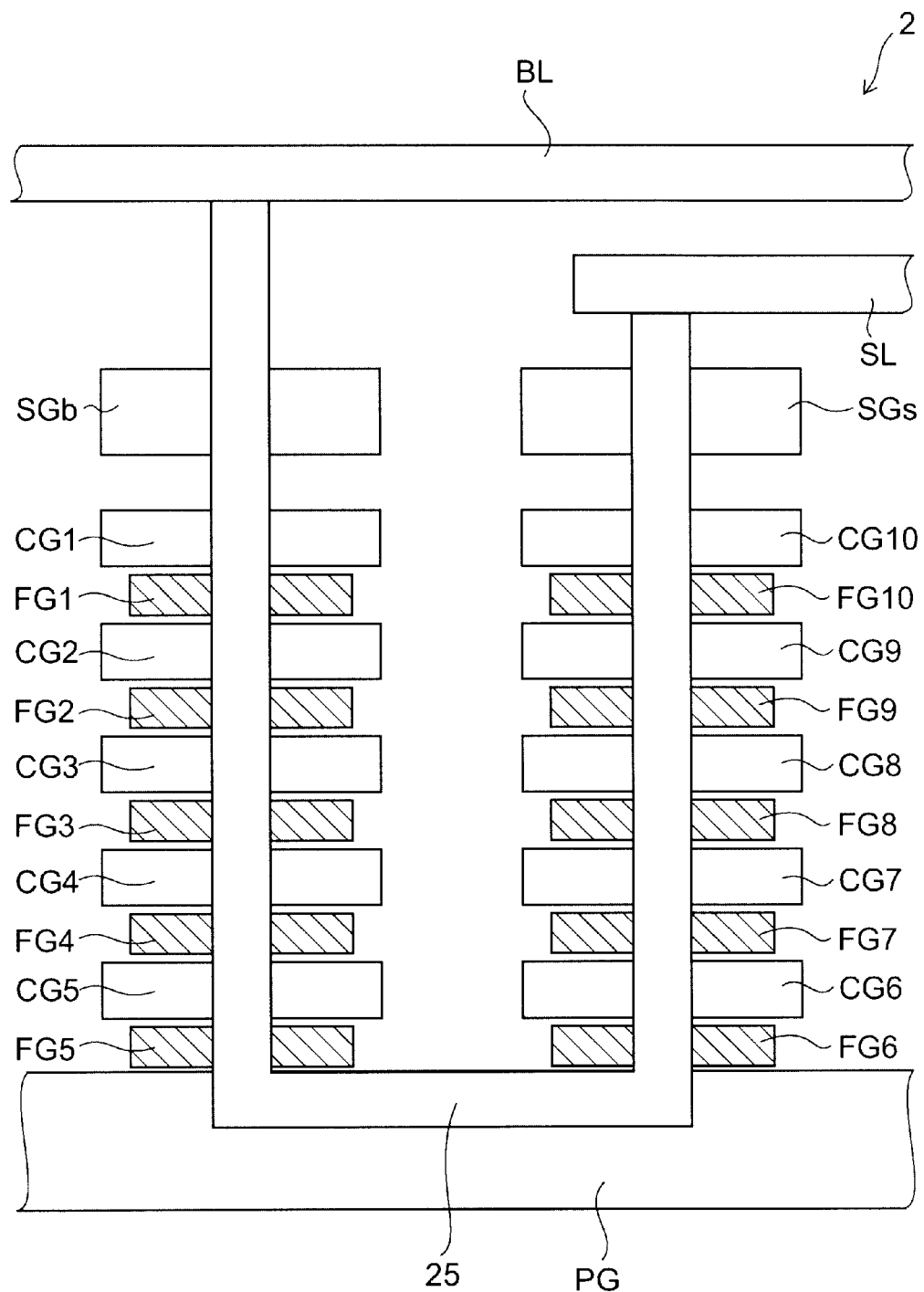
FIG. 17 is a schematic cross-sectional view explaining a operation of a nonvolatile semiconductor memory device according to the second embodiment.

FIG. 17 is a schematic cross-sectional view describing the operation of the nonvolatile semiconductor memory device according to this embodiment.

In FIG. 17, for convenience of description, control gate electrodes CG through which one U-shaped pillar 25 penetrates are marked with the signs "CG1" to "CG10" from a bit line BL side to a source line SL side. Similarly, floating gate electrodes FG through which the one U-shaped pillar 25 penetrates are marked with the signs "FG1" to "FG10" from the bit line BL side to the source line SL side. Further, out of two selection gate electrodes SG through which the one U-shaped pillar 25 penetrates, the selection gate electrode on the bit line BL side is marked with the sign "SGb", and the selection gate electrode on the source line SL side is marked with the sign "SGs." The operation of writing, erasing, and reading data will now be described.

(Writing Operation)

The case where data is written in the floating gate electrode FG2 through which an optional U-shaped pillar 25 (hereinafter referred to as "selected pillar") penetrates will be described.

First, the electric potential of the selection gate electrode SGb through which the selected pillar penetrates is set to the power source potential Vdd (for example, 3 V). The electric potential of the bit line BL to which the selected pillar is connected is set to the grounding potential GND (0 V). Thereby, the selection transistor on the bit line side that is formed at the intersection of the selection gate electrode SGb and the selected pillar becomes in the ON state. On the other hand, the electric potentials of the other bit lines BL are set to the power source potential Vdd (for example, 3 V). Thereby, the selection transistors of the other U-shaped pillars 25 on the bit line side become in the OFF state.

Further, the electric potential of the selection gate electrode SGs that belongs to the selected pillar is set to the grounding potential GND (0 V), and the electric potential of the source line SL that is connected to the selected pillar is set to the power source potential Vdd (for example, 3 V). Thereby, the selection transistor on the source line side that is formed at the intersection of the selection gate electrode SGs and the selected pillar becomes in the OFF state. Consequently, the selected pillar is connected to the bit line BL and is cut off from the source line SL.

In this state, the electric potentials of the control gate electrodes CG2 and CG3 that are located on both sides of the floating gate electrode FG2 are raised to an electric potential Vpgm (for example, 20 V). Thereby, the electric potential of the floating gate electrode FG2 rises due to the coupling with the control gate electrodes CG2 and CG3 to become an electric potential close to the electric potential Vpgm (for example, 20 V). On the other hand, the electric potentials of the control gate electrodes CG other than the control gate electrodes CG2 and CG3 and the conductive film PG are set to an electric potential Vpass (for example, 10 V). Thereby, all the transistors that are formed at the intersections of the selected pillar and the control gate electrodes CG become in the ON state. Therefore, the electric potential of the selected pillar becomes an electric potential close to the electric potential of the bit line BL (0 V). Thereby, a high voltage is applied between the floating gate electrode FG2 and the selected pillar, and an electron is injected from the selected pillar into the floating gate electrode FG2 via the insulating film TOx, by the tunnel effect. Consequently, data are written in the floating gate electrode FG2.

At this time, the electric potentials of other floating gate electrodes FG4 to FG10 through which the selected pillar penetrates become an electric potential close to the electric potential Vpass (for example, 10 V), because the electric potentials of the control gate electrodes CG on both sides thereof and the conductive film PG are set to the electric potential Vpass (for example, 10 V) and the coupling with them raises the voltage. With regard to the floating gate electrodes FG1 and FG3 that are located next to the floating gate electrode FG2, the electric potential of one of the control gate electrodes on both sides is set to the electric potential Vpgm (for example, 20 V) and the electric potential of the other is set to the electric potential Vpass (for example, 10 V). Accordingly, the electric potentials of the floating gate electrodes FG1 and FG3 become an electric potential between the electric potential of the floating gate electrode FG2 and the electric potentials of the floating gate electrodes FG4 to FG10. In this embodiment, it is necessary to select the electric potential Vpgm and the electric potential Vpass so that, when injecting an electron into the floating gate electrode FG2, no electron may be injected into the floating gate electrodes FG1 and FG3.

(Erasing Operation)

Erasing is collectively performed for all floating gate electrodes.

First, the electric potentials of all the control gate electrodes CG and the conductive film PG are set to the grounding potential GND (0 V). Thereby, the electric potentials of all the floating gate electrodes FG become an electric potential close to the grounding potential GND (0 V), by the coupling with the control gate electrodes CG and the conductive film PG.

In this state, the electric potential of the bit line BL (or the bit line BL and the source line SL) is raised to an electric potential Vera (for example, 20 V). A little later than this voltage raising, the electric potential of the selection gate electrode SGb (or the selection gate electrodes SGb and SGs) is raised to an electric potential VeraG. At this time, by setting the electric potential VeraG higher than the electric potential Vera, GIDL (gate induced drain leakage) occurs at a portion of the U-shaped pillar 25 surrounded by the selection gate electrode SGb (or the selection gate electrodes SGb and SGs). That is, a (hole-electron) pair is generated and accelerated. Then, the resulting hole is injected into the U-shaped pillar 25 to raise the electric potential of the U-shaped pillar 25.

As described above, the electric potentials of the floating gate electrodes FG are close to the grounding potential GND (0 V). Therefore, when the electric potential of the U-shaped pillar 25 rises, a high voltage is applied between the U-shaped pillar 25 and the floating gate electrodes FG, and electrons stored in floating gate electrodes FG are extracted into the U-shaped pillar 25 via the insulating film TOx. Thereby, the data written in all the floating gate electrodes FG are collectively erased.

(Reading Operation)

The case where the data written in the floating gate electrode FG2 through which an optional selected pillar penetrates are read out will be described.

The electric potential of the bit line BL that is connected to the selected pillar is set to an electric potential VBL (for example, 1 V), and the electric potentials of all the source lines SL are set to the grounding potential GND (0 V). The electric potentials of the selection gate electrodes SGb and SGs through which the selected pillar penetrates are set to the power source potential Vdd (for example, 3 V). Thereby, the selection transistors that are each formed at the intersection of the selected pillar and the selection gate electrode SGb or SGs become both in the ON state.

The electric potentials of the control gate electrodes CG other than the control gate electrodes CG2 and CG3, and the electric potential of the conductive film PG are set to an electric potential Vread (for example, 5 V). The electric potential Vread is appropriately selected so that all the transistors formed at the intersections of the selected pillar and the control gate electrodes CG may become in the ON state, and also all the transistors formed at the intersections of the selected pillar and the floating gate electrodes FG other than the floating gate electrode FG2 may become in the ON state due to a rise in the electric potentials of the floating gate electrodes FG, which is caused by the coupling with the control gate electrodes CG.

Then, the electric potentials of the control gate electrodes CG2 and CG3 that are disposed on both sides of the floating gate electrode FG2 are set to the grounding potential GND (0 V) or an electric potential between the grounding potential GND (0 V) and the electric potential Vread (for example, 5 V). This electric potential is appropriately selected so that the transistor formed at the intersection of the selected pillar and the floating gate electrode FG2 may become in the OFF state when an electron is stored in the floating gate electrode FG2, and this transistor may become in the ON state when an electron is not stored in the floating gate electrode FG2. That is, the threshold of the transistor formed at the intersection of the selected pillar and the floating gate electrode FG2 depends on whether or not an electron is stored in the floating gate electrode FG2, and the electric potentials of the control gate electrodes CG2 and CG3 are set so that the conduction state of this transistor may depend on this threshold.

Thereby, portions of the selected pillar surrounded by the selection gate electrodes SGb and SGs, all the control gate electrodes CG, and the floating gate electrodes FG other than the floating gate electrode FG2 become constantly in the ON state, and the portion surrounded by the floating gate electrode FG2 varies in conduction state with whether or not a charge is stored in the floating gate electrode FG2. That is, when an electron is stored in the floating gate electrode FG2, then a current does not flow from the bit line BL to the source line SL, and when an electron is not stored in the floating gate electrode FG2, then a current flows from the bit line BL to the source line SL via the selected pillar. Therefore, by measuring this current, the data written in the floating gate electrode FG2 can be read out.

Hereinabove, the invention is described with reference to embodiments. However, the invention is not limited to those embodiments. For example, one skilled in the art may appropriately perform addition, deletion, or design modification of components, or perform addition, omission, or condition modification of processes on the embodiments described above. Such modification also is included in the scope of the invention to the extent that the spirit of the invention is included.

The invention claimed is:

1. A method for manufacturing a nonvolatile semiconductor memory device comprising:
    forming a stacked body by alternately stacking a plurality of interlayer insulating films and a plurality of control gate electrodes;
    forming a through-hole extending in a stacking direction in the stacked body;
    etching a portion of the interlayer insulating films facing the through-hole via the through-hole to remove the portion;
    forming a first insulating film on inner faces of the through-hole and the portion in which the interlayer insulating films are removed;
    forming a floating gate electrode made of conductive material on the first insulating film in the portion in which the interlayer insulating film is removed;
    forming a second insulating film so as to cover a portion of the floating gate electrode facing the through-hole; and
    burying a semiconductor pillar in the through-hole,
    wherein wet etching is performed as the etching.

2. A method for manufacturing a nonvolatile semiconductor memory device comprising:
    forming a stacked body by alternately stacking a plurality of interlayer insulating films and a plurality of control gate electrodes;
    forming a through-hole extending in a stacking direction in the stacked body;
    etching a portion of the interlayer insulating films facing the through-hole via the through-hole to remove the portion:,
    forming a first insulating film on inner faces of the through-hole and the portion in which the interlayer insulating films are removed;
    forming a floating gate electrode made of conductive material on the first insulating film in the portion in which the interlayer insulating film is removed;
    forming a second insulating film so as to cover a portion of the floating gate electrode facing the through-hole; and
    burying a semiconductor pillar in the through-hole,
    wherein
    the forming the floating gate electrode includes:
        forming a semiconductor layer on inner faces of the through-hole and the portion in which the interlayer insulating film is removed;
        removing the semiconductor layer from a bottom face of the through-hole by anisotropic etching; and
        removing the semiconductor layer from a side face of the through-hole by isotropic etching.

3. The method according to claim 2, wherein the forming the semiconductor layer is performed by depositing silicon by low pressure chemical vapor deposition.

4. The method according to claim 2, wherein the anisotropic etching is performed by reactive ion etching.

5. The method according to claim 2, wherein the isotropic etching is performed by chemical dry etching.

* * * * *